US010185794B2

(12) United States Patent
Guerin et al.

(10) Patent No.: US 10,185,794 B2
(45) Date of Patent: Jan. 22, 2019

(54) OVERLAYING OF CLOCK AND DATA PROPAGATION IN EMULATION

(71) Applicant: Synopsys, Inc., Mountain View, CA (US)

(72) Inventors: Xavier Guerin, Wissous (FR); Alexander Rabinovitch, Shrewsbury, MA (US)

(73) Assignee: SYNOPSYS, INC., Mountain View, CA (US)

( * ) Notice: Subject to any disclaimer, the term of this patent is extended or adjusted under 35 U.S.C. 154(b) by 216 days.

(21) Appl. No.: 15/083,807

(22) Filed: Mar. 29, 2016

(65) Prior Publication Data

US 2017/0109466 A1 Apr. 20, 2017

Related U.S. Application Data

(60) Provisional application No. 62/243,948, filed on Oct. 20, 2015.

(51) Int. Cl.
*G06F 17/50* (2006.01)

(52) U.S. Cl.
CPC ........ *G06F 17/5027* (2013.01); *G06F 17/504* (2013.01); *G06F 2217/62* (2013.01)

(58) Field of Classification Search
CPC . G06F 17/5027; G06F 17/504; G06F 2217/62
See application file for complete search history.

(56) References Cited

U.S. PATENT DOCUMENTS

| 9,244,795 | B2* | 1/2016 | Rabinovitch | ......... G06F 11/273 |
| 2004/0111252 | A1* | 6/2004 | Burgun | .............. G01R 31/3183 703/28 |
| 2016/0314239 | A1* | 10/2016 | Rabinovitch | ....... G06F 17/5081 |

* cited by examiner

*Primary Examiner* — Naum B Levin
(74) *Attorney, Agent, or Firm* — Alston & Bird LLP

(57) ABSTRACT

A computer-implemented method for configuring a hardware verification system is presented. The method includes receiving a first data representative of a first design including a first sequential element configured to be evaluated in accordance with a first signal. The method further includes transforming the first data into a second data representative of a second design. The second data includes a third data associated with a second sequential element including functionality of the first sequential element and a fourth data associated with a first logic circuit. The evaluation of the second sequential element at cycle i of the hardware verification system is performed in accordance with the first logic circuit and a value of the first signal as computed during cycle i−1 of the hardware verification system when the second data is compiled for programming into the hardware verification system, where i is an integer number.

54 Claims, 8 Drawing Sheets

OVERLAYING OF CLOCK AND DATA PROPAGATION IN EMULATION

CROSS-REFERENCES TO RELATED APPLICATIONS

This application claims the benefit of priority under 35 U.S.C. § 119(e) to U.S. Provisional Application No. 62/243,948, entitled "OVERLAYING OF CLOCK AND DATA PROPAGATION IN EMULATION," filed Oct. 20, 2015, the content of which is incorporated herein by reference in its entirety.

BACKGROUND

The present disclosure relates generally to testing a circuit design, and more specifically to testing such circuit using a programmable emulation tool having improved performance.

Integrated circuit (IC) designers commonly describe their designs in hardware description language (HDL) such as Verilog, VHDL, SystemC, and the like. In IC design, hardware emulation may refer to the process of replicating behavior of one or more pieces of hardware, hereinafter also referred to as a design under test (DUT), with another piece of hardware, such as a special-purpose emulation system. An emulation model is usually generated in accordance with a hardware description language source code representing the design under test. The emulation model is compiled into a format used to program the emulation system. Running the emulation system that has been programmed enables debugging and functional verification of the design under test. Overall progress of the emulation is usually controlled by a master clock signal generated on the emulator hardware.

With recent advances in technology, circuit designs are becoming more and more complex. Therefore, there is a need in the art for improving performance of hardware emulation systems, reducing overhead while mapping the design to programmable hardware in the emulation systems, and reducing verification time.

SUMMARY

According to one embodiment of the present invention, a computer-implemented method for configuring a hardware verification system is presented. The method includes receiving, in the computer, a first data representative of a first design including a first sequential element configured to be evaluated in accordance with a first signal, when the computer is invoked to configure the verification system. The method further includes transforming, using the computer, the first data into a second data representative of a second design. The second data includes a third data associated with a second sequential element including functionality of the first sequential element and a fourth data associated with a first logic circuit. The evaluation of the second sequential element at cycle i of the hardware verification system is performed in accordance with the first logic circuit and a value of the first signal as computed during cycle i−1 of the hardware verification system when the second data is compiled for programming into the hardware verification system, where i is an integer number.

According to one embodiment, the second design causes a value of the first signal as computed during cycle i to be propagated to a data input terminal of the first logic circuit. According to one embodiment, evaluation of the first logic circuit at cycle i is performed in accordance with a second signal different from the first signal before a value of the first signal as computed during cycle i is caused by the second design to be propagated to a data input terminal of the first logic circuit.

According to one embodiment, a value of a second signal different from the first signal and as computed during cycle i−1 is caused to be propagated at cycle i to a data input terminal of the second sequential element. According to one embodiment, evaluation of the second sequential element is caused to be disabled during a cycle of the hardware verification system corresponding to a cycle of the first design that starts a multitude of cycles of the first design.

According to one embodiment, the first logic circuit includes a flip-flop evaluated in accordance with a second signal different from the first signal, the second signal being coupled to a clock input terminal of the flip-flop. According to one embodiment, the first logic circuit includes a latch evaluated in accordance with a second signal different from the first signal, the second signal being coupled to an enable input terminal of the latch.

According to one embodiment, the second sequential element is a flip-flop having a clock input terminal coupled to an output terminal of the first logic circuit. According to one embodiment, the second sequential element is a latch having an enable input terminal coupled to an output terminal of the first logic circuit.

According to one embodiment, the first design further includes a third sequential element configured to generate the first signal and be evaluated in accordance with a second signal different from the first signal. The third sequential element is further configured to receive a third signal different from the first and second signals. The third signal is coupled from a first output terminal of the first sequential element to a first data input terminal of the third sequential element. The first logic circuit at cycle i causes propagation of a value of the third signal as computed during cycle i−1 in accordance with a transition of the value of the second signal as computed asynchronously during cycle i. According to one embodiment, the third signal consists of a data path signal.

According to one embodiment, in the first design, the third sequential element is a flip-flop and the second signal is coupled to a clock input of the flip-flop. According to one embodiment, in the first design, the third sequential element is a latch and the second signal is coupled to an enable input of the latch.

According to one embodiment, the first logic circuit is caused to asynchronously select at cycle i the value of either the first signal as computed during cycle i−1 or the third signal as computed during cycle i−1 in accordance with the transition of the value of the second signal as computed asynchronously during cycle i.

According to one embodiment, the first logic circuit is caused during cycle i to asynchronously select at the start of cycle i the value of the first signal as computed during cycle i−1. The first logic circuit is further caused during cycle i to asynchronously select before the end of cycle i the value of the third signal as computed during cycle i−1. According to one embodiment, the second design causes a value of the second signal as computed during cycle i to be propagated to a data input terminal of the first logic circuit.

According to one embodiment, evaluation of the first logic circuit at cycle i is performed in accordance with a fourth signal different from the first, second, and third signals before a value of the second signal as computed during cycle i is caused by the second design to be propagated to a data input terminal of the first logic circuit.

According to one embodiment, the transforming causes the first logic circuit to replace the third sequential element.

According to one embodiment of the present invention, a non-transitory computer-readable storage medium including instructions, which when executed by a computer, cause the computer to receive a first data representative of a first design including a first sequential element configured to be evaluated in accordance with a first signal, when the computer is invoked to configure the verification system. The instructions further cause the computer to transform the first data into a second data representative of a second design. The second data includes a third data associated with a second sequential element including functionality of the first sequential element and a fourth data associated with a first logic circuit. The evaluation of the second sequential element at cycle i of the hardware verification system is performed in accordance with the first logic circuit and a value of the first signal as computed during cycle i−1 of the hardware verification system when the second data is compiled for programming into the hardware verification system, where i is an integer number.

According to one embodiment of the present invention, a system for configuring a hardware verification system is presented. The system is configured to receive a first data representative of a first design including a first sequential element configured to be evaluated in accordance with a first signal, when the computer is invoked to configure the verification system. The system is further configured to transform the first data into a second data representative of a second design. The second data includes a third data associated with a second sequential element including functionality of the first sequential element and a fourth data associated with a first logic circuit. The evaluation of the second sequential element at cycle i of the hardware verification system is performed in accordance with the first logic circuit and a value of the first signal as computed during cycle i−1 of the hardware verification system when the second data is compiled for programming into the hardware verification system, where i is an integer number.

A better understanding of the nature and advantages of the embodiments of the present invention may be gained with reference to the following detailed description and the accompanying drawings.

DETAILED DESCRIPTION

The term "programmable device" is used herein to refer to an integrated circuit designed to be configured and/or reconfigured after manufacturing. Programmable devices may include programmable processors, such as field programmable gate arrays (FPGAs) and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks can be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

Figure 1:
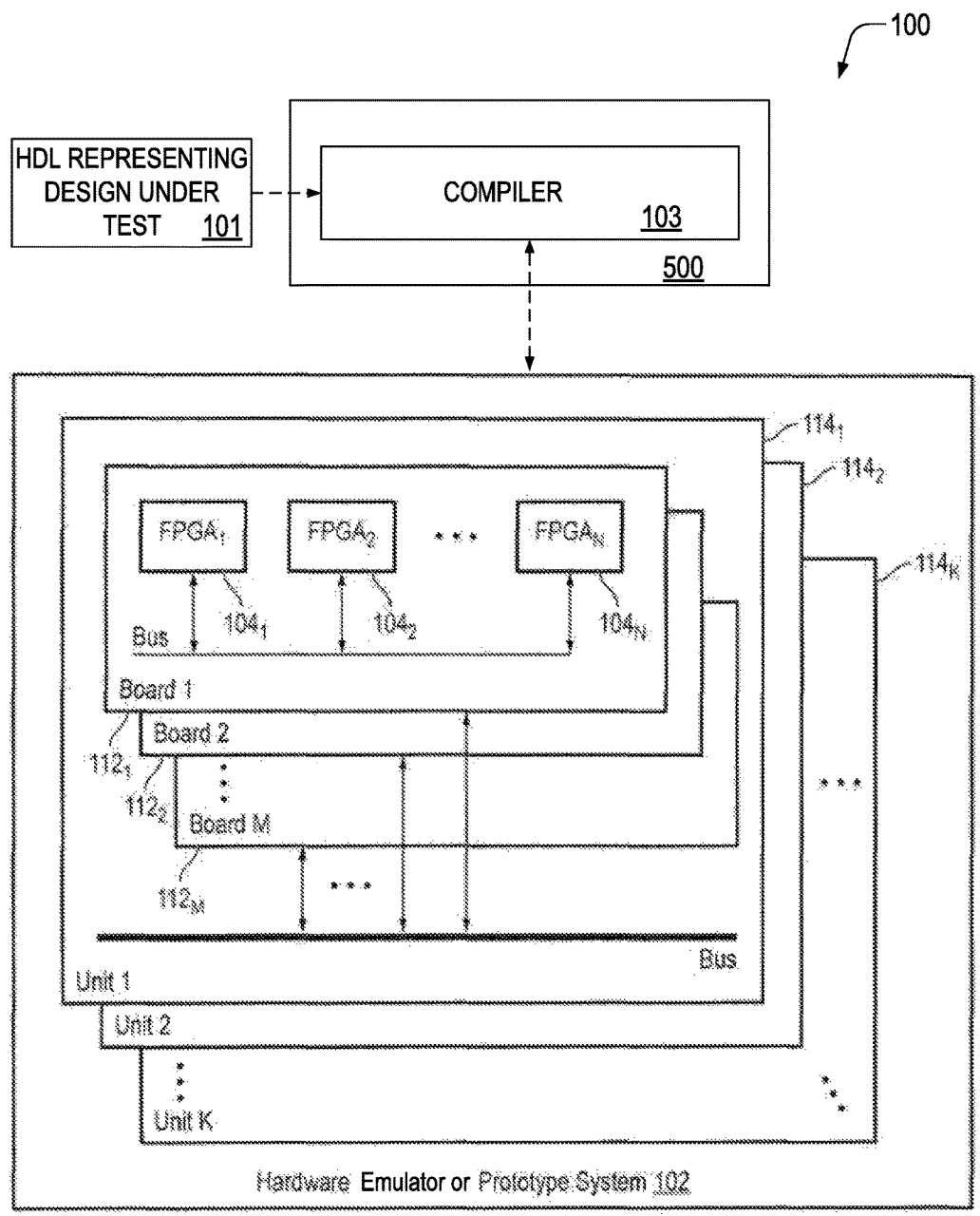
FIG. 1 depicts an exemplary high level block diagram of a hardware emulation or prototype system, according to one embodiment of the present invention.

Hardware emulation and/or prototyping systems may utilize one or more programmable devices. FIG. 1 is an exemplary high-level block diagram of a hardware verification system 100, in accordance with one embodiment of the present invention. Hardware verification system 100 may be used to verify, test or debug a circuit design. Hardware verification system 100 may include a hardware emulator and/or prototype system 102, hereinafter also referred to as a hardware verification system, and a computer system 500 that is described in reference to FIG. 6. As depicted in FIG. 1, hardware emulator and/or prototype system 102 may be coupled to computer system 500, which may include a compiler 103 module that may receive a hardware description language code representing a design under test 101, hereinafter also referred to as "design under test," "circuit design," or "design."

Compiler 103 may include a multitude of various software modules that may or may not include a dedicated compiler module, however for the purposes of this description may be referred to simply as "compiler." Compiler 103 may transform, change, reconfigure, add new functions to, and/or control the timing of design under test 101 that facilitate verification, emulation, or prototyping of design under test 101. Further, compiler 103 may compile the code or data representing design under test 101 and any associated changes into a binary image used to program the hardware primitives disposed in hardware emulator and/or prototype system 102. Thereby, the logical functions and timing of design under test 101 that may ultimately be implemented by hardware in an integrated circuit chip may instead be first implemented in hardware emulator and/or prototype system 102. Among other advantages, verification of the design in hardware may be accomplished at much higher speed than by software verification alone.

Hardware emulator and/or prototype system 102 may include a multitude of programmable processors such as FPGAs 104$_1$ through 104$_N$, and other blocks (not shown), such as memories, input/output devices, other processors, and the like. The hardware emulation and/or prototype system receives a circuit design, and programs the programmable processors to verify behavior of the circuit design. Hardware emulator and/or prototype system 102 may include a primary or master system clock from which a number of other clock signals can be generated.

Programmable processors FPGAs 104$_1$-104$_N$ may be placed into one or more hardware boards 112$_1$ through 112$_M$. Multiple of such boards can be placed into a hardware unit, e.g. 114$_1$. The boards within a unit may be connected using the backplane of the unit or any other types of connections. In addition, multiple hardware units (e.g., 114$_1$ through 114$_K$) can be connected to each other by cables or any other means to form a multi-unit system. In general, the hardware emulator or prototype system 102 may be made of a single board, a single unit with multiple boards, or multiple units without departing from the teachings of the present disclosure.

When running the design circuit in an FPGA, each emulation and/or prototype cycle can be divided into two time periods: i) clock generation activity time and ii) combinational circuit evaluation time. In known emulation techniques, the resulting minimum emulation cycle time is the sum of the clock generation activity time and the combinational circuit evaluation time. During the clock generation activity time, values of input variables that are used as a clock when coupled to a clock pin of a latch or flop are generated and propagated to the clock pin of the latch or flop. The combinational circuit evaluation time corresponds to time used for evaluation of sequential elements, e.g. latches and flops, and combinational circuits that contribute to evaluation of data inputs for the sequential elements, which is usually referred to as combinational paths or data paths. A design net or variable that is connected to a clock pin, e.g. clock terminal, of latch or a flop is referred to as a derived clock. A primary clock of the design may be viewed as a derived clock according to this definition.

When the combinational circuit includes a latch, the latch is made transparent when evaluated or enabled and non-transparent when not-evaluated or disabled anytime in a timing cycle in accordance with a signal, such as a clock signal, that is coupled to an enable input pin of the latch. When the combinational circuit includes a flip-flop, the flip-flop is made transparent when evaluated or enabled and non-transparent when not-evaluated or disabled in accordance with a signal, such as a clock signal, that is coupled to a clock input pin of the flip-flop when the value of the clock signal changes signal value or transitions, e.g. a low logic value to high logic value transition.

Values of derived clocks need to be known at the time of evaluating the flops and/or latches for proper circuit operation. A clock tree includes primary design input variables that are input to any (optional) combinational logic used to generate a derived clock signal at an input of a flop and/or latch. Accordingly, the clock tree may drive an input of a clock tree sequential circuit or element, e.g. a clock tree flip flop, or a design sequential circuit, causing the clock tree sequential circuit or design sequential circuit to be evaluated in accordance with the derived clock signal at the clock tree sequential circuit or the design sequential circuit. A clock tree sequential circuit generates a clock signal as an output that is coupled to evaluate another sequential circuit. As used throughout this description, coupled means directly or indirectly connected, while connected means directly connected. In contrast, a design sequential circuit generates an output signal that is coupled only to data input signals of other sequential circuits, i.e. data path signals, and not used to evaluate any other sequential circuits.

When a clock tree is mapped onto the FPGA, the propagation of primary design input variables through any (optional) combinational logic or through paths with unaccounted for long delay times may result in unintended design circuit malfunction during emulation. However, to ensure correct operation of the design, only stable values of the clocks should be utilized to evaluate the design circuits to prevent unintended design operation during emulation or prototyping, which may be accomplished by allowing clock trees to settle to final values at derived clock inputs.

During the first portion of the emulation cycle, the clock tree evaluation takes place while no design combinational path are propagated. In the second phase of the emulation cycle the design combinational data paths are propagated while no clock tree evaluation is done any more. If inter-FPGA routing resources dedicated to clock propagation are idling during the combinational paths propagation and resources dedicated to the combinational data paths are idling during the clock propagation, the overall routing solution is not optimal since the emulator may run slower relative to the embodiments that overlap both the clock generation activity time and the combinational circuit evaluation time as described below.

In one embodiment, during emulation run time, evaluation is performed by fully overlaying in any given cycle the propagation of combinational data paths and the evaluation of the values of derived clocks for the next cycle in a design under test, hereinafter also referred to as "overlay technique." Unlike known emulation techniques, the resulting minimum emulation cycle time is instead the longest of either the clock generation activity time or the combinational circuit evaluation time. For example if the clock generation activity time is equal to the combinational circuit evaluation time, then the minimum emulation cycle time using the embodiments described herein may be one half of the minimum emulation cycle of known techniques. The overlay technique may be applied by transforming, using the computer system 500, the original design under test 101, hereinafter also referred to as "untransformed design" or "original design," into a transformed design before programming the transformed design into the FPGAs of the hardware emulator or prototype system 102.

In one embodiment, before the first emulation cycle begins, no design flops and latches are evaluated so the design is brought into a consistent state. Instead of evaluating flops and/or latches, values of primary variables are injected into the design and propagated until the values of all derived clocks are computed and received at their corresponding receiving terminals.

Every subsequent cycle is evaluated as follows. Stable values of derived clocks as evaluated in the immediately previous cycle are propagated to design flops and latches, which shall in turn result in propagation of combinational data paths in accordance with the immediately previous cycle. Concurrently, the values of derived clocks for the present cycle are computed and propagated in parallel. Accordingly, the propagation of combinational data paths in accordance with the immediately previous cycle is overlaid or performed concurrently with the computing and propagating of the values of derived clocks for the present cycle.

In one example, the above technique may be described as follows in terms of the emulation cycles of the original and transformed designs. The first cycle starting the sequence of the multitude of emulation cycles of the transformed design computes stable values of derived clocks of the original design. The second emulation cycle of the transformed design conducts the evaluation of design flops, latches, and combinational paths propagation of the original design that corresponds to the first emulation cycle, i.e. the immediately previous emulation cycle, of the original design, and concurrently computes the values of the derived clocks that correspond to the second emulation cycle, i.e. present emulation cycle, of the original design. In other words, cycle i of emulation, i.e. the present emulation cycle, of the transformed design conducts the evaluation of design flops, latches and combinational paths propagation, i.e. data paths, as computed during or corresponding to cycle i−1 of the original design, i.e. the immediately previous cycle. Further, cycle i of emulation concurrently computes the values of the derived clocks that correspond to the present cycle i of the original design, where i is an integer number. It is understood that data paths and clock paths are distinct since clock paths control the sequencing in time of circuit elements while data paths do not control sequencing.

Figure 2A:
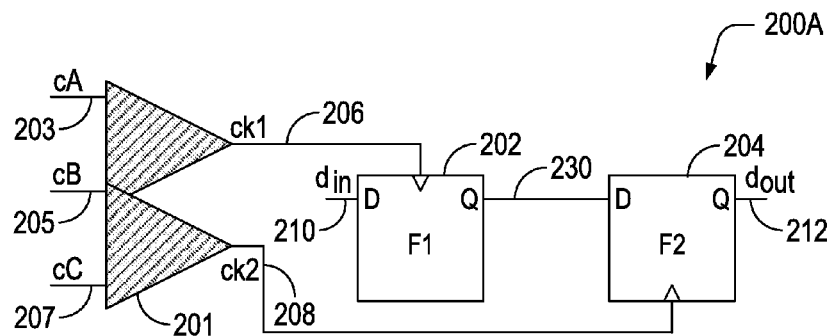
FIG. 2A depicts an exemplary first untransformed circuit design, according to one embodiment of the present invention.

FIG. 2A depicts an exemplary first untransformed circuit design 200A, in accordance with one embodiment of the present invention. First untransformed circuit design 200A may be represented in HDL code or data and included in the design under test 101 depicted in FIG. 1. FIG. 2A depicts first untransformed circuit design 200A may include a clock tree 201, a flip-flop F1 202, and a flip-flop F2 204. Clock tree 201 may include combinatorial logic (not shown). Clock tree 201 receives a multitude of primary design inputs cA 203, cB 205, and cC 207 at the beginning of a design cycle and generates a multitude of clock signals ck1 206 and ck2 208 in accordance with the combinatorial logic in clock tree 201. Flip-flop F1 202, hereinafter also referred to as a selected sequential element or circuit, receives a data input signal $d_{in}$ 210 and generates an output signal 230, at the positive edge of clock signal ck1 206. Similarly, flip-flop F2 204, receives signal 230 as an input and generates signal $d_{out}$ 212 as an output at every positive edge of clock ck2 208. It is understood that there may be other combinational functions or logic (not shown) between flip-flop F1 202 and flip-flop F2 204 so that the Q output terminal of flip-flop F1 202 is coupled to the D input terminal of flip-flop F2 204. Flip-flop F1 202 is a design sequential circuit or element that may be defined in Verilog as:

always @(posedge ck1) q<=$d_{in}$.

The clock generation activity time may include the time period between the injection of primary design inputs cA 203, cB 205, cC 207, and data input signal $d_{in}$ 210 and the time to propagate the multitude of clock signals ck1 206 and ck2 208 to their respective derived clock input pins at flip-flop F1 202 and flip-flop F2 204 respectively. The combinational circuit evaluation time is the time to evaluate the data path from the D input of flip-flop F1 202 to the D input of flip-flop F2 204, which may only be done after the derived clock signal ck1 206 is stable at the clock input of flip-flop F1 202.

The resulting minimum emulation cycle time according to known emulation techniques may be the sum of the clock generation activity time and the combinational circuit evaluation time, which may be relatively long because the clock signals or paths c1 206, c2 208, 230 may not be mapped ideally into the FPGAs for minimizing delay times. For example, some or all of the paths ck1 206, ck2 208, 230 may extend across separate FPGA chip boundaries resulting in significant inter-FPGA signal propagation delays. For another example, some or all of the paths ck1 206, ck2 208, 230 may include asynchronous combinational logic (not shown) that may provide additional timing delays.

Figure 2B:
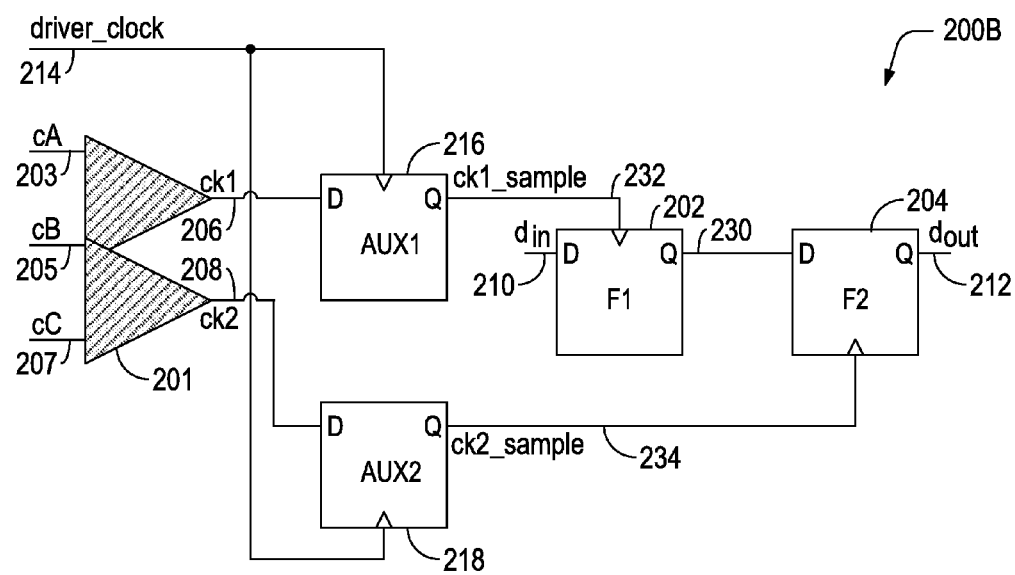
FIG. 2B depicts an exemplary first transformed circuit design, which is transformed from the first untransformed circuit design depicted in FIG. 2A, according to one embodiment of the present invention.

FIG. 2B depicts an exemplary first transformed circuit design 200B, which is transformed from the first untransformed circuit design 200A depicted in FIG. 2A, according to one embodiment of the present invention. The elements and function of first transformed circuit design 200B are similar to first untransformed circuit design 200A with the following exceptions. First transformed circuit design 200B may include an auxiliary logic circuit flip-flop AUX1 216, an auxiliary logic circuit flip-flop AUX2 218, and a signal driver_clock 214 that are inserted in the netlist of the first untransformed circuit design 200A. The transformation may be done by compiler 103 and provides for applying the overlay technique that overlays clock and data evaluation times in the first transformed circuit design 200B to speed up performance during emulation or prototyping as described below.

The transformation and operation of first transformed circuit design 200B will be described in reference to clock signal ck1 206 and flip-flop F1 202, however it is understood that the transformation associated with clock signal ck2 208, flip-flop F2 204 is symmetric to the transformation associated with clock signal ck1 206, flip-flop F1 202. For example, auxiliary logic circuit flip-flop AUX1 216 receives clock signal ck1 206 as a data input and generates signal ck1_sample 232 as an output, when evaluated at every positive edge of signal driver_clock 214. Similarly, auxiliary logic circuit flip-flop AUX2 218 receives clock signal ck2 208 as a data input and generates signal ck2_sample 234 as an output, when evaluated at every positive edge of signal driver_clock 214. Flip-flop F1 202, receives a data input signal $d_{in}$ 210 and generates an output signal 230, when evaluated at the positive edge of signal ck1_sample 232. Flip-flop F2 204 receives output signal 230 as a data input and generates signal $d_{out}$ 212 as an output when evaluated at every positive edge of signal ck2_sample 234.

Although, the invention has been described with reference to flip-flop F1 202 representing the same type of element in first untransformed circuit design 200A as in first transformed circuit design 200B by way of an example, it is understood that the invention is not limited by any additional or different functionality (not shown), so long as flip-flop (hereinafter also referred to as "sequential element") F1 202 in first transformed circuit design 200B includes the same functionality as flip-flop F1 202 in first untransformed circuit design 200A. For example, additional functionality for flip-flop F1 202 in first transformed circuit design 200B may include additional enable inputs for additional evaluation control by additional control or clock signals (not shown).

It is understood that there may be other combinational functions or logic (not shown) between auxiliary logic circuit flip-flop AUX1 216 and flip-flop F1 202 so that the Q output terminal of auxiliary logic circuit flip-flop AUX1 216 is coupled to the D data input terminal of flip-flop F1 202, and similarly for the signal ck2_sample 234 path. In one embodiment, the interconnect path for signal driver_clock 214 may be characterized as a higher speed signal path in the FPGA, i.e. a "low skew" signal path, compared to the FPGA signal resources used for clock tree 201, signal ck1, and signal ck2 for reasons to be explained below.

Operation of auxiliary logic circuit flip-flop AUX1 216 and flip-flop F1 202 after the transformation in first transformed circuit design 200B may be described in Verilog as follows:

always @(posedge driver_clock) ck1_sample<=ck1;
    always @(posedge ck1_sample) q<=d.

It is understood that alternative descriptions for the operation of auxiliary logic circuit flip-flop AUX1 216 and flip-flop F1 202 after the transformation in first transformed circuit design 200B may be alternatively described in Verilog as follows:

always @(posedge driver_clock) ck1_sample<=ck1;
    assign c_pos=ck1 & ~ck1_sample;
    always @(posedge driver_clock);
    if (c_pos) q<=d, or alternatively
    always @(posedge driver_clock);
    q<=(c_pos)? d: q_sample.

In one embodiment, ck1 may be generalized to all derived clock signals C received by any sequential circuit. A unique single copy of C_sample may be maintained in each FPGA where C is used as a derived clock and driver_clock is the driver clock for each emulation cycle or a primary clock of a domain in hardware emulator and/or prototype system 102. It is noted that just one auxiliary flip flop need be inserted for each derived clock signal and not for every sequential circuit coupled to the same derived clock signal, which results in insignificant additional FPGA resource use. For example, it may be common to have hundreds or even thousands of other sequential circuits (not shown) all being evaluated by the same clock signal ck1 206 in first untransformed circuit design 200A.

However, only one additional auxiliary logic circuit flip flop AUX1 216 need be inserted into first transformed circuit design 200B to generate signal ck1_sample 232, which is then coupled to all the hundreds or even thousands of other sequential circuits (not shown) all being evaluated in parallel by the same signal ck1_sample 232. Therefore the insertion of an additional auxiliary flip-flop draws insignificantly on available FPGA resources. It is also noted that signal driver_clock 214 and any associated register and state machine is already available before transformation and needed as a clock for timing each cycle of emulation whether for the transformed or untransformed designs.

Figure 4A:
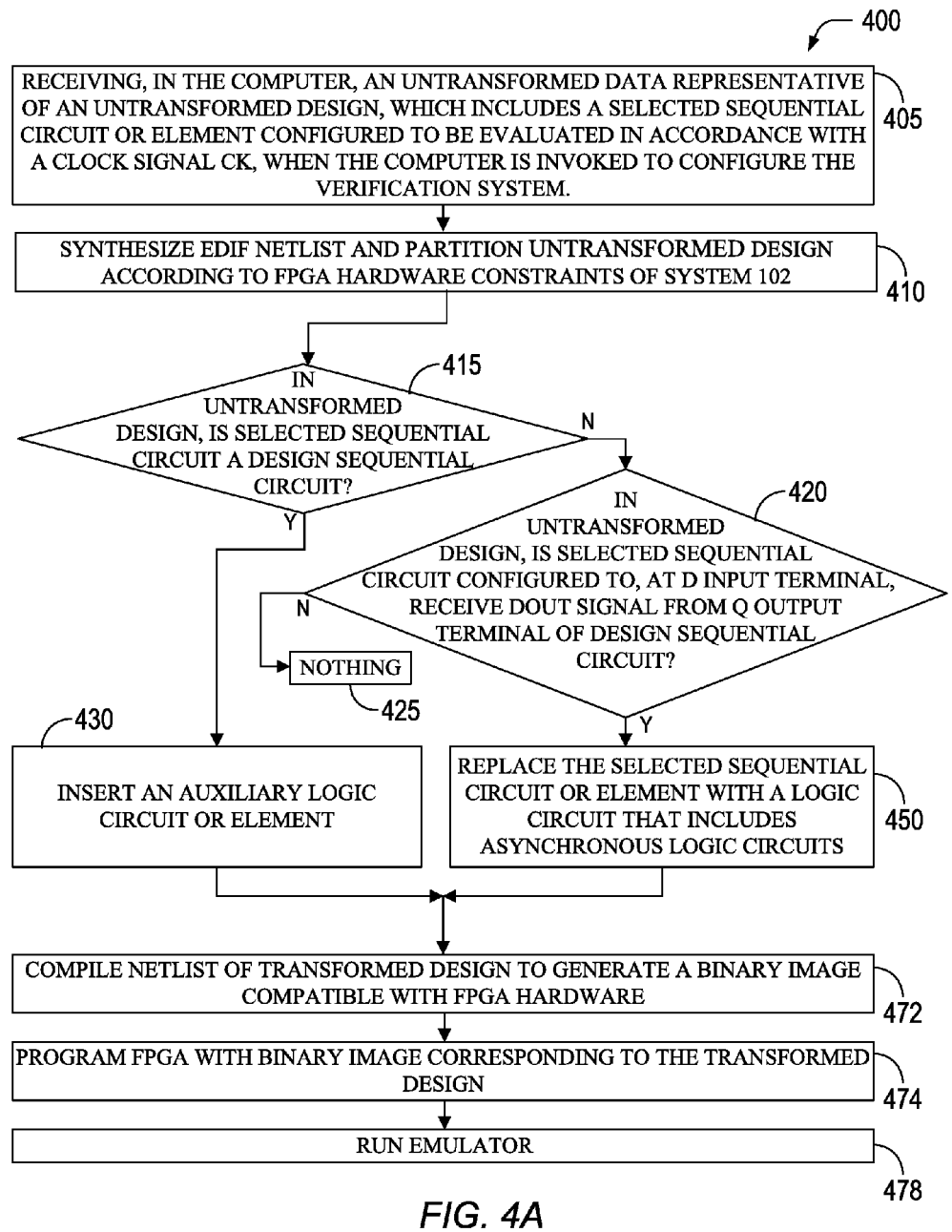
FIG. 4A depicts a simple exemplary flowchart for configuring a hardware emulator or prototype system to apply the overlay transformation, in accordance with one embodiment of the present invention.

FIG. 4A depicts a simple exemplary flowchart 400 for configuring a hardware emulator or prototype system 102 to apply the overlay transformation, in accordance with one embodiment of the present invention. Referring simultaneously to FIGS. 2A-2B, and 4A, computer system 500 receives 405 a first data representative of an input design circuit, e.g. example untransformed circuit design 200A, including a sequential logic circuit, e.g. flip-flop F1 202, configured to be evaluated in accordance with clock signal C 206 when computer system 500 is invoked to configure the hardware emulator or prototype system 102.

Compiler 103 synthesizes 410 an electronic design interchange format (EDIF) netlist from the HDL code representing the design under test 101 and partitions design under test 101 according to FPGA hardware constraints of hardware emulator or prototyping system 102. For example, portions of design under test 101 are allocated to be later programmed into $FPGA_1$ $104_1$, $FPGA_2$ $104_2$, through $FPGA_N$ $104_N$ according to the hardware logic primitives and interconnect resources that are available in each FPGA.

The compiler selects one of the multitude of sequential circuits in the untransformed design, e.g. flip-flop F1 202, to test 415 if the selected sequential circuit is a design sequential circuit. Flip-flop F1 202 is a design sequential circuit because flip-flop F1 202 generates an output signal 230 that is coupled only to the D data input signal of the other sequential circuit flip-flop F2 204 and not used to evaluate any other sequential circuits. Finding that flip-flop F1 202 is a design sequential circuit, the compiler inserts 430 an auxiliary logic circuit flip-flop AUX1 216.

Figure 4B:
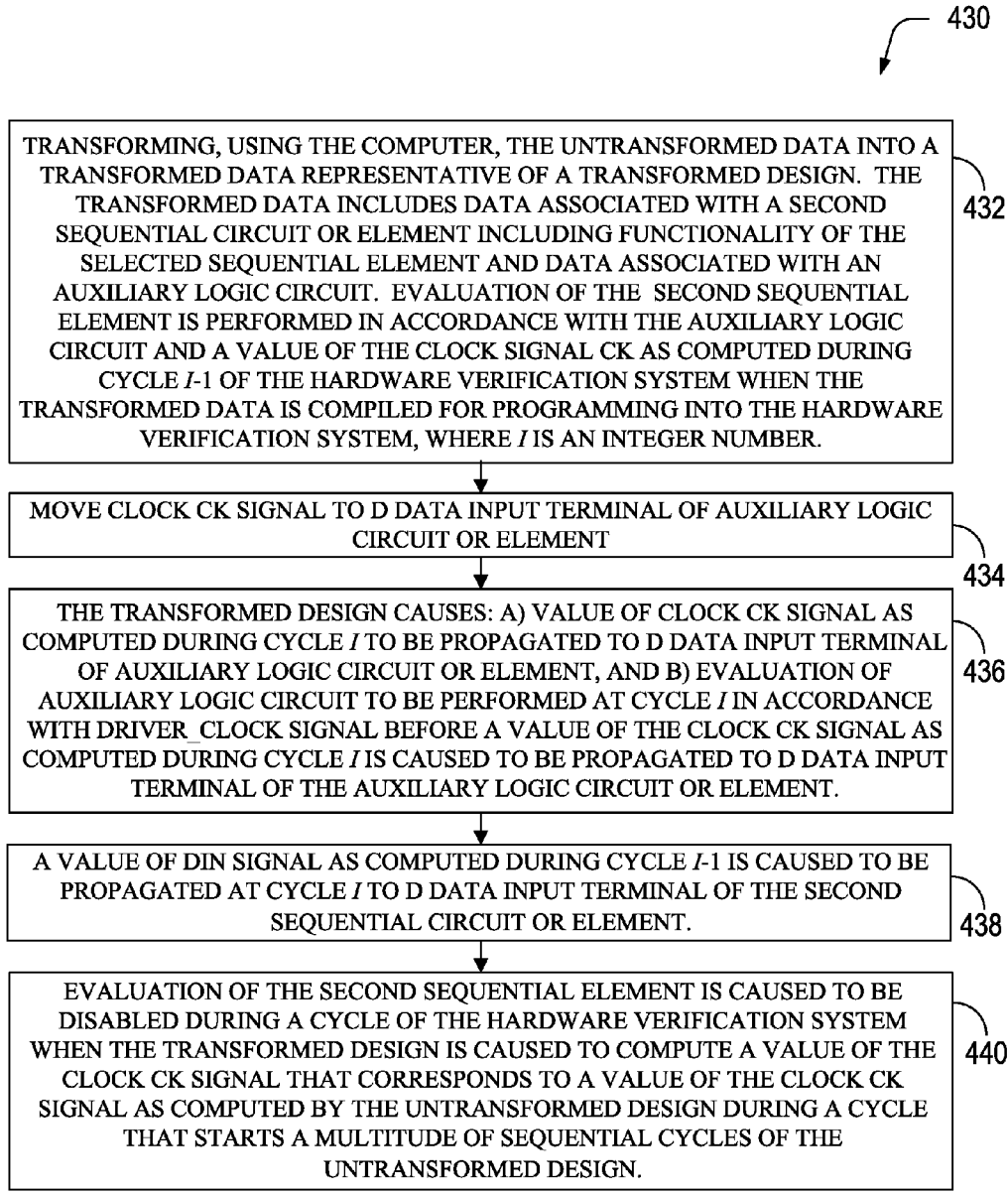
FIG. 4B depicts a simple exemplary flowchart for the step of inserting an auxiliary logic circuit depicted in FIG. 4A, in accordance with one embodiment of the present invention.

FIG. 4B depicts a simple exemplary flowchart for the step of inserting 430 an auxiliary logic circuit flip-flop AUX1 216 depicted in FIG. 4A, in accordance with one embodiment of the present invention. Referring simultaneously to FIGS. 2A-2B, and 4B, compiler 103 in computer system 500 changes or transforms 432 the untransformed code or data representing first untransformed circuit design 200A into a transformed code or data representing first transformed circuit design 200B. The transforming further includes inserting, using computer system 500, the auxiliary logic circuit flip-flop AUX1 216 configured to be evaluated in accordance with signal driver_clock 214, which is different from clock signal ck1 206.

Signal driver_clock 214 includes a multitude of cycles in time associated with a multitude of emulation cycles. In one embodiment, driver_clock 214 may be associated with determining the cycle count for the hardware verification system as the primary or master clock. For each cycle i of signal driver_clock 214, where i is an integer number, the auxiliary logic circuit flip-flop AUX1 216 is evaluated in accordance with a value of signal driver_clock 214 as computed during the (present) cycle i of the hardware verification system, hereinafter also referred to as the cycle i value, while concurrently evaluating the selected sequential circuit flip-flop F1 202 in accordance with a value of the clock signal ck1 206 as computed during the (immediately previous) cycle i−1 of the hardware verification system, hereinafter also referred to as the cycle i−1 value, when the second data for first transformed circuit design 200B is compiled for programming into hardware emulator or prototype system 102.

Compiler 103 moves 434 clock signal ck1 206 to the D data input terminal of auxiliary logic circuit or element flip-flop AUX1 216. For each cycle i of signal driver_clock 214, first transformed circuit design 200B is caused 436 to propagate cycle i value of clock signal ck1 206 to the D data input terminal of auxiliary logic circuit flip-flop AUX1 216. However, because signal driver_clock 214 is a low skew signal as described above, in first transformed circuit design 200B the evaluation of auxiliary logic circuit flip-flop AUX1 216 may be performed at cycle i in accordance with signal driver_clock 214 before a value of the clock ck signal as computed during cycle i is caused to be propagated to or received at D data input terminal of the auxiliary logic circuit or element.

Therefore, when auxiliary logic circuit flip-flop AUX1 216 is evaluated at the positive edge of clock signal driver_clock 214, auxiliary logic circuit flip-flop AUX1 216 receives at its D input terminal the cycle i−1 value of the clock signal ck1 206, which is then latched or held at its Q output terminal and on signal ck1_sample 232. In other words signal ck1_sample 232 holds a sample of the immediately previous cycle value of clock signal ck1 206. For each cycle i of signal driver_clock 214, compiler 103 causes 438 first transformed circuit design 200B to propagate a value of data input signal $d_{in}$ 210 as computed during cycle i−1 of the hardware verification system to the D data input terminal of selected sequential circuit flip-flop F1 202.

Therefore, cycle i of emulation, i.e. the present emulation cycle, of the transformed design, e.g. first transformed circuit design 200B, conducts the evaluation of design flops, latches and combinational paths propagation, e.g. evaluate selected sequential circuit flip-flop F1 202, that propagates values of data along the data paths, e.g. data input signal $d_{in}$ 210 propagated to output signal 230, corresponding to (immediately previous) cycle i−1 of the original design, e.g. first untransformed circuit design 200A. Further, concurrently computed are the values of the derived clocks, e.g. signals cA, cB, cC calculated through clock tree 201 and propagated through clock signal ck1 206, corresponding to (present) cycle i of the original design, e.g. first untransformed circuit design 200A. The propagation of combinational data paths in accordance with the immediately previous cycle overlaid or performed concurrently with the computing and propagating of the values of derived clocks for the present cycle results in faster emulation performance compared to the untransformed design.

Compiler 103 causes first transformed circuit design 200B to disable 440 evaluation of sequential element F1 202 during a cycle of hardware verification system 100 when first transformed circuit design 200B is caused to compute a value of clock ck signal that corresponds to a value of clock ck signal as computed by first untransformed circuit design 200A during a cycle that starts a multitude of sequential cycles of first untransformed circuit design 200A. In other words evaluation of sequential element F1 202 is caused to be disabled during a cycle of hardware verification system 100 corresponding to a cycle of first untransformed circuit design 200A that starts a multitude of cycles of first untransformed circuit design 200A. Referring again to FIG. 4A and simultaneously to FIG. 1, compiler 103 then compiles 472 the modified netlist to generate a binary image that is compatible with the FPGAs 104₁-104_N in hardware emulator or prototype system 102. In other words, the binary image code is adapted to be programmed into the FPGA hardware. Next, FPGAs 104₁-104_N are programmed 474 with the binary image corresponding to the design under test that is transformed for emulation purposes. Hardware emulator or prototype system 102 may now be run 478 with the overlay of clock and data time periods to improve performance.

Figure 3A:
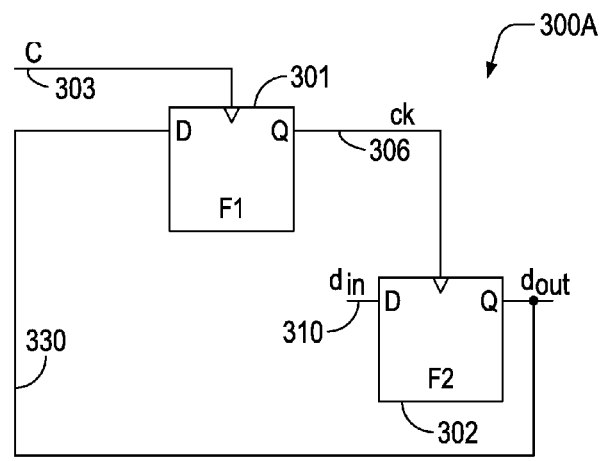
FIG. 3A depicts an exemplary second untransformed circuit design, according to one embodiment of the present invention.

FIG. 3A depicts an exemplary second untransformed circuit design 300A, according to one embodiment of the present invention. Second untransformed circuit design 300A includes a clock-tree sequential circuit flip-flop F1 301 and a design sequential circuit flip-flop F2 302. Clock-tree sequential circuit flip-flop F1 301 receives signal $d_{out}$ 330 on its D data input terminal and generates clock signal ck 306 as an output, at a positive edge of clock signal C 303. Design sequential circuit flip-flop F2 302, generates the output, signal $d_{out}$ 330, based on its data input $d_{in}$ 310, at positive edge of the clock signal ck 306. It is understood that there may be other combinational functions or logic (not shown) between clock-tree sequential circuit flip-flop F1 301 and design sequential circuit flip-flop F2 302 so that the Q output terminal of clock-tree sequential circuit flip-flop F1 301 is coupled to the clock input terminal of design sequential circuit flip-flop F2 302. Similarly, there may be other combinational functions or logic (not shown) between the Q output terminal of design sequential circuit flip-flop F2 302 and the D data input terminal of clock-tree sequential circuit flip-flop F1 301 so that the Q output terminal of design sequential circuit flip-flop F2 302 may be coupled to the D data input terminal of clock-tree sequential circuit flip-flop F1 301 without changing the scope of the overlay technique.

Because clock-tree sequential circuit flip-flop F1 301 is a clock-tree sequential circuit, it is evaluated as part of the computation of derived clocks. Since clock-tree sequential circuit flip-flop F1 301 needs a stable value of $d_{out}$ 330 on its D data input to be properly evaluated, both flip-flops F1 202 and F2 204 shall be evaluated in the same emulation cycle i and it is semantically required that the output of F2 is factored into the evaluation of F1 in the same emulation cycle. Second untransformed circuit design 300A may be defined in Verilog as follows:

always @(posedge C)//F1
ck<=dout; //clock tree flop, because ck is used as clock pin of flop F2
always @(posedge ck)//F2
dout<=din;// design flop A timing problem could manifest when an output of a design sequential circuit generates a data input for a clock-tree sequential circuit that generates the clock signal for the design sequential circuit as in second untransformed circuit design 300A, when the overlay technique transformation described above is applied to the clock-tree sequential circuit flip-flop F1 301.

Arguendo to demonstrate the problem, if both clock-tree sequential circuit flip-flop F1 301 and design sequential circuit flip-flop F2 302 are treated as design sequential circuits using the previous overlay technique embodiments described above and in reference to FIG. 4B, the evaluation of clock-tree sequential circuit flip-flop F1 301 would be delayed by one cycle because C_sample would be used as the clock for clock-tree sequential circuit flip-flop F1 301, and the evaluation of design sequential circuit flip-flop F2 302 would be delayed by an additional cycle because of the use of ck_sample as the clock signal for design sequential circuit flip-flop F2 302. In the transformed emulation events are described as follows:

posedge of clock signal C 303 in cycle i results in evaluation of clock-tree sequential circuit flip-flop F1 301 in cycle 41, and posedge of ck in cycle 41 results in evaluation of design sequential circuit flip-flop F2 302 in cycle i+2.

In other words, the positive edge transition of clock signal C, i.e. posedge of C, in cycle i results in the evaluation of design sequential circuit flip-flop F2 302 in cycle i+2, which is two cycles of delay that creates de-synchronization of the system beyond recovery because, in contrast, the emulation of the second untransformed circuit design 300A defines that posedge of clock signal C 303 in cycle i should result in the evaluation of design sequential circuit flip-flop F2 302 in the same cycle i. Therefore, clock-tree sequential circuit flip-flop F1 301 may not use the overlay technique in the transformed emulation without creating the above semantic breakage problem. In one embodiment, in order to ensure that the proper value of signal $d_{out}$ 330 has an effect on clock-tree sequential circuit flip-flop F1 301 in the same cycle, clock-tree sequential circuit flip-flop F1 301 is transformed into an auxiliary logic circuit 340, as depicted in FIG. 3B.

Figure 3B:
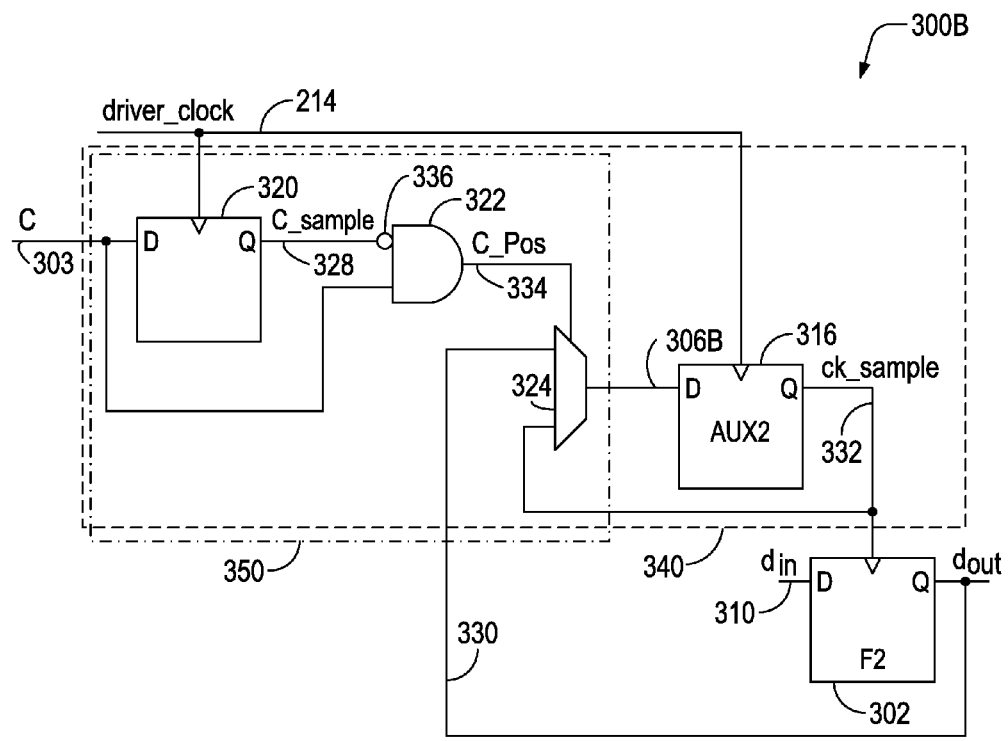
FIG. 3B depicts an exemplary second transformed circuit design, which is transformed from the second untransformed circuit design depicted in FIG. 3A, according to one embodiment of the present invention.

FIG. 3B depicts an exemplary second transformed circuit design 300B, which is transformed from the second untransformed circuit design 300A depicted in FIG. 3A, according to one embodiment of the present invention. Second transformed circuit design 300B includes a design sequential circuit flip-flop F2 302 and an auxiliary logic circuit 340, which replaces clock-tree sequential circuit flip-flop F1 301 in order to eliminate the semantic breakage problem as will be described below. Design sequential circuit flip-flop F2 302 may be similar in structure and function as design sequential circuit flip-flop F1 202 depicted in reference to FIG. 2B. Referring to FIG. 3B, auxiliary logic circuit 340 includes asynchronous sequential circuit 350 and auxiliary logic circuit flip-flop AUX2 316. Asynchronous sequential circuit 350 includes a C_sample sequential circuit flip-flop 320, an AND gate 322, and a multiplexer 324.

C_sample sequential circuit flip-flop 320 receives clock signal C 303 on its D data input terminal and generates signal C_sample 328 as an output, at every positive edge of the clock signal driver_clock 214. AND gate 322 generates signal C_Pos 334 by receiving a copy of clock signal C 303 and the inverse of signal C_sample 228. The inversion of signal C_sample 228 may be accomplished by using an available inverting Q output of C_sample sequential circuit flip-flop 320, by a separate invertor, or by an inverting input on AND gate 322, any one of which is depicted by "bubble" 336. Multiplexer 324 receives signal C_Pos 334 on its selection control terminal. Multiplexer 324 further receives signal $d_{out}$ 330, and signal ck_sample 332 as data inputs, and generates signal ck/dout 306B as output in accordance with the value of signal C_Pos 334. Signal ck/dout 306B is received at the D data input terminal of auxiliary logic circuit flip-flop AUX2 316.

Signals C_sample 328 and ck_sample 32 are the values of the corresponding design signals sampled at the emulation cycle boundary, respectively clock signals C 303 and ck 306 from the previous emulation cycle. The feedback from design sequential circuit flip-flop F2 302 back into clock tree sequential circuit flip-flop F1 301 is factored in properly during the same emulation cycle maintaining the correct semantic behavior as described below. Second transformed circuit design 300B may partially be defined in Verilog as follows:

assign C_pos=C & ~C_sample;
assign ck=C_pos? dout: ck_sample;

Referring simultaneously to FIGS. 4A, 3A, and 3B, compiler 103 selects each sequential circuit to test at step 415. When compiler 103 selects design sequential circuit flip-flop F2 302, the test 415 causes the insertion of auxiliary logic circuit flip-flop AUX2 316 into the netlist as described in reference to step 430. However, when compiler 103 selects clock tree sequential circuit flip-flop F1 301 the outcome of test 415 is negative because clock-tree sequential circuit flip-flop F1 301 is not a design sequential circuit. Then compiler 103 performs a second test 420 to determine whether or not in second untransformed circuit design 300A, is the selected clock tree sequential circuit flip-flop F1 301 configured to, at its D input terminal, receive signal $d_{out}$ from Q output terminal of design sequential circuit flip-flop F2 302. Because test 420 is affirmative for the selected clock tree sequential circuit flip-flop F1 301, the compiler causes the replacement or transformation 450 of selected clock tree sequential circuit flip-flop F1 301 with auxiliary logic circuit 340 that includes asynchronous sequential circuit 350. If the outcome of test 420 is negative, compiler 103 does nothing 425 to the selected clock-tree sequential circuit.

Figure 4C:
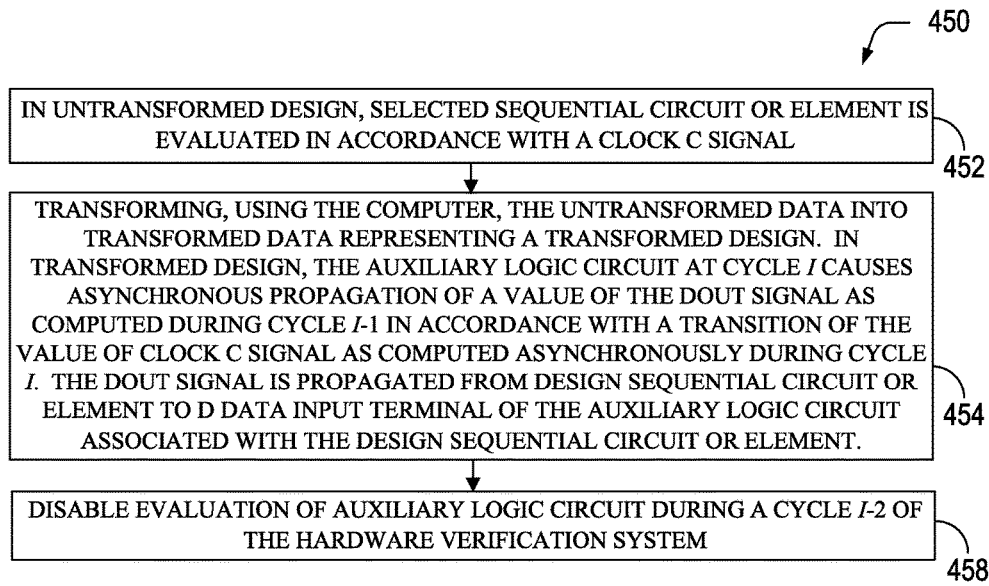
FIG. 4C depicts a simple exemplary flowchart for the step of replacing a selected clock tree sequential circuit with an auxiliary logic circuit that includes an asynchronous sequential circuit as depicted in FIG. 4A, in accordance with one embodiment of the present invention.

FIG. 4C depicts a simple exemplary flowchart for the step of replacing 450 a selected clock tree sequential circuit flip-flop F1 301 with auxiliary logic circuit 340 that includes asynchronous sequential circuit 350 as depicted in FIG. 4A, in accordance with one embodiment of the present invention. Recall, in second untransformed circuit design 300A, the clock-tree sequential circuit flip-flop F1 301 is evaluated 452 in accordance with the clock signal C 303. Referring simultaneously to FIGS. 4C, 3A, and 3B, compiler 103 transforms, using the computer, the untransformed code into a transformed code representing second transformed circuit design 300B. In second transformed circuit design 300B compiler 103 causes, for each cycle i of signal driver_clock 214, the asynchronous propagation 454 of a value of signal $d_{out}$ 330 as computed during cycle i−1 from design sequential circuit flip-flop F2 302 to D data input terminal of the auxiliary logic circuit flip-flop AUX2 316 associated with design sequential circuit flip-flop F2 302 in accordance with an asynchronous transition of a value of clock signal C 303 as computed asynchronously during cycle i as will be described in more detail below. Compiler 103 disables 458 evaluation of auxiliary logic circuit flip-flop AUX2 316 during a cycle i−2 of the hardware verification system or a cycle starting the sequence of the multitude of cycles, in order that the derived clock signals are initially stabilized at the start of emulation.

Figure 4D:
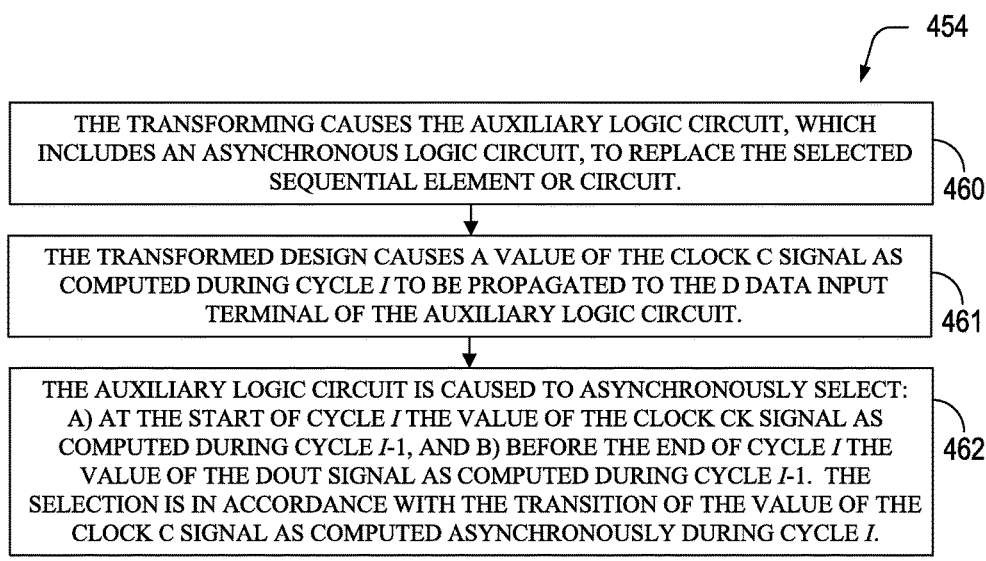
FIG. 4D depicts a simple exemplary flowchart for the step of asynchronous propagation of cycle i−1 value of signal $d_{out}$ as depicted in FIG. 4C, in accordance with one embodiment of the present invention.

FIG. 4D depicts a simple exemplary flowchart for the step of asynchronous propagation 454 of cycle i−1 value of signal $d_{out}$ 330 as depicted in FIG. 4C, in accordance with one embodiment of the present invention. Referring simultaneously to FIGS. 4D, 3A, and 3B, the transformation by compiler 103 causes replacement 460 of the selected clock-tree sequential circuit flip-flop F1 301 with auxiliary logic circuit 340 that includes asynchronous sequential circuit 350, which is different from the selected clock-tree sequential circuit flip-flop F1 301. The second transformed design causes a value of clock C signal 303 as computed during cycle i to be propagated 461 to a D data input terminal of auxiliary logic circuit 340. Compiler 103 further causes asynchronous sequential circuit 350 to, for each cycle i of signal driver_clock 214, asynchronously select 462 between cycle i−1 value of signal $d_{out}$ 330 and cycle i−1 value of clock signal ck 306 via signal ck_sample 332, thereby generating a signal ck/$d_{out}$ 306B coupled to D data input terminal of auxiliary logic circuit flip-flop AUX2 316 associated with design sequential circuit flip-flop F2 302, the selection being in accordance with the asynchronous transition of clock signal C 303 through asynchronous sequential circuit 350.

Auxiliary logic circuit 340 is caused by the compiler to asynchronously select 462 at the start of cycle i the value of clock signal ck 306 as computed during cycle i−1. Auxiliary logic circuit 340 is further caused by the compiler to asynchronously select before the end of cycle i the value of signal $d_{out}$ 330 as computed during cycle i−1. The selection is in accordance with the transition of the value of clock signal ck 306 as computed asynchronously during cycle i, as described in greater detail below.

Figure 4E:
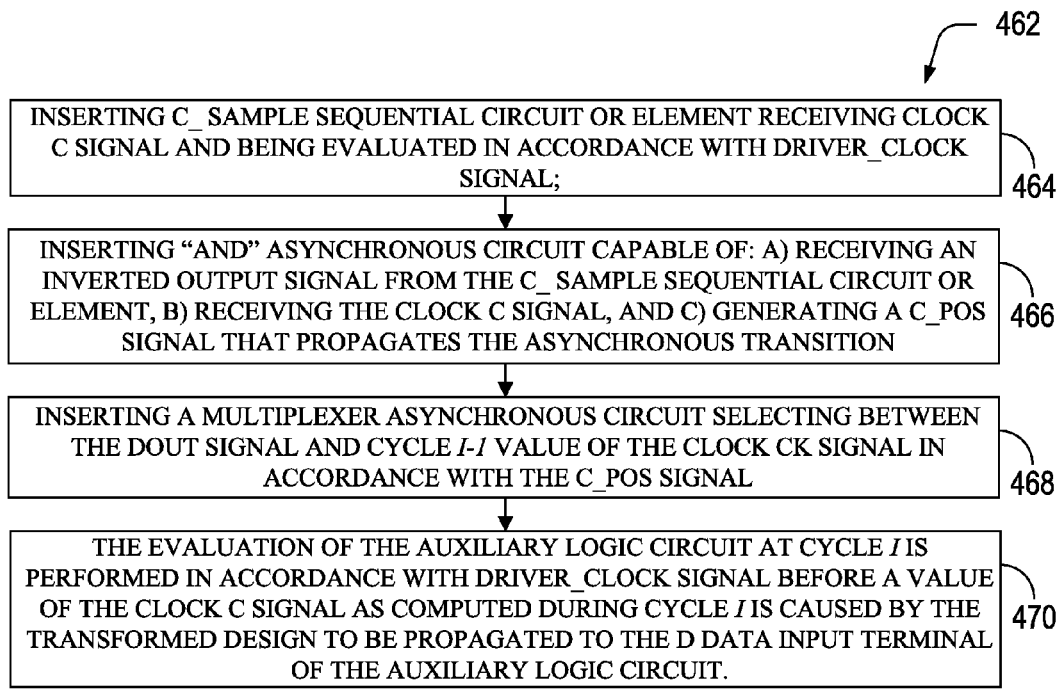
FIG. 4E depicts a simple exemplary flowchart for the step of asynchronously selecting between cycle i−1 value of signal $d_{out}$ and cycle i−1 value of signal clock ck as depicted in FIG. 4D, in accordance with one embodiment of the present invention.

FIG. 4E depicts a simple exemplary flowchart for the step of asynchronously selecting 462 between cycle i−1 value of signal $d_{out}$ 330 and cycle i−1 value of clock signal ck 306 as depicted in FIG. 4D, in accordance with one embodiment of the present invention. Compiler 103 inserts the following circuit elements in asynchronous sequential circuit 350. Referring simultaneously to FIGS. 4E, 3A, and 3B, compiler 103 inserts 464 C_ sample sequential circuit flip-flop 320 receiving clock signal C 303 as a data input and being evaluated in accordance with signal driver_clock 214. Compiler 103 inserts 466 AND gate 322 asynchronous circuit adapted to: i) receive an inverted output signal from C_ sample sequential circuit flip-flop 320, ii) receive clock signal C, and iii) generate signal C_POS 334 that propagates the asynchronous transition of clock signal C 303. Compiler 103 inserts 468 multiplexer 324 asynchronous circuit selecting between cycle i−1 value of signal $d_{out}$ 330 and cycle i−1 value of the clock signal ck 306 via signal ck_sample 332 in accordance with signal C_POS 334, which controls the multiplexer selection. As described above, compiler 103 causes asynchronous sequential circuit 350 to, for each cycle i of signal driver_clock 214, the selection of cycle i−1 value of clock signal ck 306 substantially at the start of cycle i, and the selection of cycle i−1 value of signal $d_{out}$ 330 after the start of cycle i. The evaluation 470 of C_sample sequential circuit flip-flop 320 and auxiliary logic circuit flip-flop AUX2 316 in auxiliary logic circuit 340 at cycle i is performed in accordance with signal driver_clock 214 before a value of clock signal C 303 as computed during cycle i is caused by the second transformed design to be propagated to d data input terminal C_ sample sequential circuit flip-flop 320 of auxiliary logic circuit 340 because signal driver_clock 214 may be allocated to a low skew signal in the FPGA as discussed above. Thereby, the feedback from design sequential circuit flip-flop F2 302 back into clock tree sequential circuit flip-flop F1 301 is factored in properly during the same emulation cycle i−1 maintaining the correct semantic behavior, while also providing the simultaneous overlay of clock and data time periods for improved performance.

Figure 5:
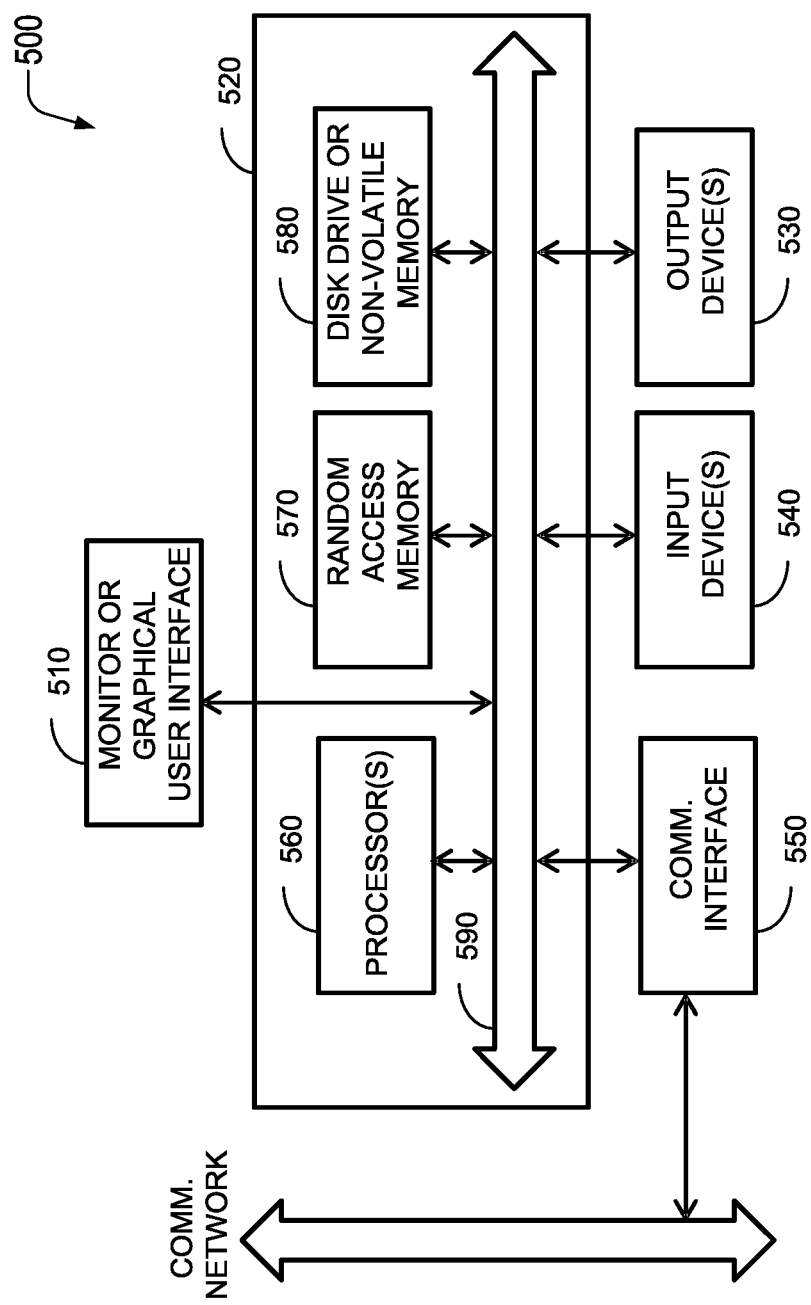
FIG. 5 depicts an example block diagram of a computer system that may incorporate embodiments of the present invention.

FIG. 5 is an example block diagram of a computer system 500 that may incorporate embodiments of the present invention. FIG. 5 is merely illustrative of an embodiment incorporating the present invention and does not limit the scope of the invention as recited in the claims. One of ordinary skill in the art would recognize other variations, modifications, and alternatives. In one embodiment, computer system 500 typically includes a monitor 510, a computer 520, user output devices 530, user input devices 540, communications interface 550, and the like.

As depicted in FIG. 5, computer 520 may include a processor(s) 560 that communicates with a number of peripheral devices via a bus subsystem 590. These peripheral devices may include user output devices 530, user input devices 540, communications interface 550, and a storage subsystem, such as random access memory (RAM) 570 and disk drive 580.

User input devices 540 include all possible types of devices and mechanisms for inputting information to computer 520. These may include a keyboard, a keypad, a touch screen incorporated into the display, audio input devices such as voice recognition systems, microphones, and other types of input devices. In various embodiments, user input devices 530 are typically embodied as a computer mouse, a trackball, a track pad, a joystick, wireless remote, drawing tablet, voice command system, eye tracking system, and the like. User input devices 540 typically allow a user to select objects, icons, text and the like that appear on the monitor 510 via a command such as a click of a button or the like.

User output devices 540 include all possible types of devices and mechanisms for outputting information from computer 520. These may include a display (e.g., monitor 510), non-visual displays such as audio output devices, etc.

Communications interface 550 provides an interface to other communication networks and devices. Communications interface 550 may serve as an interface for receiving data from and transmitting data to other systems. Embodiments of communications interface 550 typically include an Ethernet card, a modem (telephone, satellite, cable, ISDN), (asynchronous) digital subscriber line (DSL) unit, FireWire interface, USB interface, and the like. For example, communications interface 550 may be coupled to a computer network, to a FireWire bus, or the like. In other embodiments, communications interfaces 550 may be physically integrated on the motherboard of computer 520, and may be a software program, such as soft DSL, or the like.

In various embodiments, computer system 500 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 520 includes one or more Xeon microprocessors from Intel as processor(s) 560. Further, one embodiment, computer 520 includes a UNIX-based operating system.

RAM 570 and disk drive 580 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 570 and disk drive 580 may be configured to store the basic programming and data constructs that provide the functionality of the present invention.

Software code modules and instructions that provide the functionality of the present invention may be stored in RAM 570 and disk drive 580. These software modules may be executed by processor(s) 560. RAM 570 and disk drive 580 may also provide a repository for storing data used in accordance with the present invention.

RAM 570 and disk drive 580 may include a number of memories including a main random access memory (RAM) for storage of instructions and data during program execution and a read only memory (ROM) in which fixed non-transitory instructions are stored. RAM 570 and disk drive 580 may include a file storage subsystem providing persistent (non-volatile) storage for program and data files. RAM 570 and disk drive 580 may also include removable storage systems, such as removable flash memory.

Bus subsystem 590 provides a mechanism for letting the various components and subsystems of computer 520 communicate with each other as intended. Although bus subsystem 590 is depicted schematically as a single bus, alternative embodiments of the bus subsystem may utilize multiple busses.

FIG. 5 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. In addition, similar principles as described corresponding to latches and/or flops can be applied to other sequential logic circuit elements. Other modifications and variations will be apparent to those skilled in the art and are intended to fall within the scope of the appended claims.

What is claimed is:

1. A computer-implemented method for configuring a hardware verification system, the method comprising:
receiving, in the computer, a first data representative of a first design including a first sequential element configured to be evaluated in accordance with a first signal, when the computer is invoked to configure the verification system; and
transforming, using the computer, the first data into a second data representative of a second design, said second data including:
a third data associated with a second sequential element including functionality of the first sequential element; and
a fourth data associated with a first logic circuit,
wherein evaluation of the second sequential element at cycle i of the hardware verification system is performed in accordance with the first logic circuit and a value of the first signal as computed during cycle i−1 of the hardware verification system when the second data is compiled for programming into the hardware verification system,
wherein i is an integer number.

2. The computer-implemented method of claim 1, wherein the second design causes a value of the first signal as computed during cycle i to be propagated to a data input terminal of the first logic circuit.

3. The computer-implemented method of claim 1, wherein evaluation of the first logic circuit at cycle i is performed in accordance with a second signal different from the first signal before a value of the first signal as computed during cycle i is caused by the second design to be propagated to a data input terminal of the first logic circuit.

4. The computer-implemented method of claim 1, wherein a value of a second signal different from the first signal and as computed during cycle i−1 is caused to be propagated at cycle i to a data input terminal of the second sequential element.

5. The computer-implemented method of claim 1, wherein evaluation of the second sequential element is caused to be disabled during a cycle of the hardware verification system corresponding to a cycle of the first design that starts a plurality of cycles of the first design.

6. The computer-implemented method of claim 1, wherein the first logic circuit includes a flip-flop evaluated in accordance with a second signal different from the first signal, the second signal being coupled to a clock input terminal of the flip-flop.

7. The computer-implemented method of claim 1, wherein the first logic circuit includes a latch evaluated in accordance with a second signal different from the first signal, the second signal being coupled to an enable input terminal of the latch.

8. The computer-implemented method of claim 1, wherein the second sequential element is a flip-flop having a clock input terminal coupled to an output terminal of the first logic circuit.

9. The computer-implemented method of claim 1, wherein the second sequential element is a latch having an enable input terminal coupled to an output terminal of the first logic circuit.

10. The computer-implemented method of claim 1, wherein the first design further includes a third sequential element configured to:
generate the first signal;
be evaluated in accordance with a second signal different from the first signal; and
receive a third signal different from the first and second signals, said third signal being coupled from a first output terminal of the first sequential element to a first data input terminal of the third sequential element,
wherein the first logic circuit at cycle i causes propagation of a value of the third signal as computed during cycle i−1 in accordance with a transition of the value of the second signal as computed asynchronously during cycle i.

11. The computer-implemented method of claim 10, wherein the third signal consists of a data path signal.

12. The computer-implemented method of claim 10, wherein, in the first design, the third sequential element is a flip-flop and the second signal is coupled to a clock input of the flip-flop.

13. The computer-implemented method of claim 10, wherein, in the first design, the third sequential element is a latch and the second signal is coupled to an enable input of the latch.

14. The computer-implemented method of claim 10, wherein the first logic circuit is caused to asynchronously select at cycle i the value of either the first signal as computed during cycle i−1 or the third signal as computed during cycle i−1 in accordance with the transition of the value of the second signal as computed asynchronously during cycle i.

15. The computer-implemented method of claim 10, wherein the first logic circuit is caused during cycle i to asynchronously select:
   at the start of cycle i the value of the first signal as computed during cycle i−1; and
   before the end of cycle i the value of the third signal as computed during cycle i−1.

16. The computer-implemented method of claim 10, wherein the second design causes a value of the second signal as computed during cycle i to be propagated to a data input terminal of the first logic circuit.

17. The computer-implemented method of claim 10, wherein evaluation of the first logic circuit at cycle i is performed in accordance with a fourth signal different from the first, second, and third signals before a value of the second signal as computed during cycle i is caused by the second design to be propagated to a data input terminal of the first logic circuit.

18. The computer-implemented method of claim 10, wherein the transforming causes the first logic circuit to replace the third sequential element.

19. A non-transitory computer-readable storage medium comprising instructions, which when executed by a computer, cause the computer to:
   receive a first data representative of a first design including a first sequential element configured to be evaluated in accordance with a first signal, when the computer is invoked to configure the verification system; and
   transform the first data into a second data representative of a second design, said second data including:
   a third data associated with a second sequential element including functionality of the first sequential element; and
   a fourth data associated with a first logic circuit,
   wherein evaluation of the second sequential element at cycle i of the hardware verification system is performed in accordance with the first logic circuit and a value of the first signal as computed during cycle i−1 of the hardware verification system when the second data is compiled for programming into the hardware verification system,
   wherein i is an integer number.

20. The non-transitory computer-readable storage medium of claim 19, wherein the second design causes a value of the first signal as computed during cycle i to be propagated to a data input terminal of the first logic circuit.

21. The non-transitory computer-readable storage medium of claim 19, wherein evaluation of the first logic circuit at cycle i is performed in accordance with a second signal different from the first signal before a value of the first signal as computed during cycle I is caused by the second design to be propagated to a data input terminal of the first logic circuit.

22. The non-transitory computer-readable storage medium of claim 19, wherein a value of a second signal different from the first signal and as computed during cycle i−1 is caused to be propagated at cycle i to a data input terminal of the second sequential element.

23. The non-transitory computer-readable storage medium of claim 19, wherein evaluation of the second sequential element is caused to be disabled during a cycle of the hardware verification system corresponding to a cycle of the first design that starts a plurality of cycles of the first design.

24. The non-transitory computer-readable storage medium of claim 19, wherein the first logic circuit includes a flip-flop evaluated in accordance with a second signal different from the first signal, the second signal being coupled to a clock input terminal of the flip-flop.

25. The non-transitory computer-readable storage medium of claim 19, wherein the first logic circuit includes a latch evaluated in accordance with a second signal different from the first signal, the second signal being coupled to an enable input terminal of the latch.

26. The non-transitory computer-readable storage medium of claim 19, wherein the second sequential element is a flip-flop having a clock input terminal coupled to an output terminal of the first logic circuit.

27. The non-transitory computer-readable storage medium of claim 19, wherein the second sequential element is a latch having an enable input terminal coupled to an output terminal of the first logic circuit.

28. The non-transitory computer-readable storage medium of claim 19, wherein the first design further includes a third sequential element configured to:
   generate the first signal;
   be evaluated in accordance with a second signal different from the first signal; and
   receive a third signal different from the first and second signals, said third signal being coupled from a first output terminal of the first sequential element to a first data input terminal of the third sequential element,
   wherein the first logic circuit at cycle i causes propagation of a value of the third signal as computed during cycle i−1 in accordance with a transition of the value of the second signal as computed asynchronously during cycle i.

29. The non-transitory computer-readable storage medium of claim 28, wherein the third signal consists of a data path signal.

30. The non-transitory computer-readable storage medium of claim 28, wherein, in the first design, the third sequential element is a flip-flop and the second signal is coupled to a clock input of the flip-flop.

31. The non-transitory computer-readable storage medium of claim 28, wherein, in the first design, the third sequential element is a latch and the second signal is coupled to an enable input of the latch.

32. The non-transitory computer-readable storage medium of claim 28, wherein the first logic circuit is caused to asynchronously select at cycle i the value of either the first signal as computed during cycle i−1 or the third signal as computed during cycle i−1 in accordance with the transition of the value of the second signal as computed asynchronously during cycle i.

33. The non-transitory computer-readable storage medium of claim 28, wherein the first logic circuit is caused during cycle i to asynchronously select:
   at the start of cycle i the value of the first signal as computed during cycle i−1; and
   before the end of cycle i the value of the third signal as computed during cycle i−1.

34. The non-transitory computer-readable storage medium of claim 28, wherein the second design causes a value of the second signal as computed during cycle i to be propagated to a data input terminal of the first logic circuit.

35. The non-transitory computer-readable storage medium of claim 28, wherein evaluation of the first logic circuit at cycle i is performed in accordance with a fourth signal different from the first, second, and third signals before a value of the second signal as computed during cycle i is caused by the second design to be propagated to a data input terminal of the first logic circuit.

36. The non-transitory computer-readable storage medium of claim 28, wherein the transforming causes the first logic circuit to replace the third sequential element.

37. A computer system operative to:
receive a first data representative of a first design including a first sequential element configured to be evaluated in accordance with a first signal, when the computer is invoked to configure a hardware verification of the first design; and
transform the first data into a second data representative of a second design, said second data including:
a third data associated with a second sequential element including functionality of the first sequential element; and
a fourth data associated with a first logic circuit,
wherein evaluation of the second sequential element at cycle i of the hardware verification system is performed in accordance with the first logic circuit and a value of the first signal as computed during cycle i−1 of the hardware verification system when the second data is compiled for programming into the hardware verification system,
wherein i is an integer number.

38. The computer system of claim 37, wherein the second design causes a value of the first signal as computed during cycle i to be propagated to a data input terminal of the first logic circuit.

39. The computer system of claim 37, wherein evaluation of the first logic circuit at cycle i is performed in accordance with a second signal different from the first signal before a value of the first signal as computed during cycle i is caused by the second design to be propagated to a data input terminal of the first logic circuit.

40. The computer system of claim 37, wherein a value of a second signal different from the first signal and as computed during cycle i−1 is caused to be propagated at cycle i to a data input terminal of the second sequential element.

41. The computer system of claim 37, wherein evaluation of the second sequential element is caused to be disabled during a cycle of the hardware verification system corresponding to a cycle of the first design that starts a plurality of cycles of the first design.

42. The computer system of claim 37, wherein the first logic circuit includes a flip-flop evaluated in accordance with a second signal different from the first signal, the second signal being coupled to a clock input terminal of the flip-flop.

43. The computer system of claim 37, wherein the first logic circuit includes a latch evaluated in accordance with a second signal different from the first signal, the second signal being coupled to an enable input terminal of the latch.

44. The computer system of claim 37, wherein the second sequential element is a flip-flop having a clock input terminal coupled to an output terminal of the first logic circuit.

45. The computer system of claim 37, wherein the second sequential element is a latch having an enable input terminal coupled to an output terminal of the first logic circuit.

46. The computer system of claim 37, wherein the first design further includes a third sequential element configured to:
generate the first signal;
be evaluated in accordance with a second signal different from the first signal; and
receive a third signal different from the first and second signals, said third signal being coupled from a first output terminal of the first sequential element to a first data input terminal of the third sequential element,
wherein the first logic circuit at cycle i causes propagation of a value of the third signal as computed during cycle i−1 in accordance with a transition of the value of the second signal as computed asynchronously during cycle i.

47. The computer system of claim 46, wherein the third signal consists of a data path signal.

48. The computer system of claim 46, wherein, in the first design, the third sequential element is a flip-flop and the second signal is coupled to a clock input of the flip-flop.

49. The computer system of claim 46, wherein, in the first design, the third sequential element is a latch and the second signal is coupled to an enable input of the latch.

50. The computer system of claim 46, wherein the first logic circuit is caused to asynchronously select at cycle i the value of either the first signal as computed during cycle i−1 or the third signal as computed during cycle i−1 in accordance with the transition of the value of the second signal as computed asynchronously during cycle i.

51. The computer system of claim 46, wherein the first logic circuit is caused during cycle i to asynchronously select:
at the start of cycle i the value of the first signal as computed during cycle i−1; and
before the end of cycle i the value of the third signal as computed during cycle i−1.

52. The computer system of claim 46, wherein the second design causes a value of the second signal as computed during cycle i to be propagated to a data input terminal of the first logic circuit.

53. The computer system of claim 46, wherein evaluation of the first logic circuit at cycle i is performed in accordance with a fourth signal different from the first, second, and third signals before a value of the second signal as computed during cycle i is caused by the second design to be propagated to a data input terminal of the first logic circuit.

54. The computer system of claim 46, wherein the transforming causes the first logic circuit to replace the third sequential element.

* * * * *